(12) United States Patent
Olgaard et al.

(10) Patent No.: US 8,912,804 B2
(45) Date of Patent: Dec. 16, 2014

(54) METHOD FOR IDENTIFYING SELF-GENERATED SPURIOUS SIGNALS

(75) Inventors: Christian Volf Olgaard, Saratoga, CA (US); Qiang Zhao, San Jose, CA (US)

(73) Assignee: Litepoint Corporation, Sunnyvale, CA (US)

( * ) Notice: Subject to any disclaimer, the term of this patent is extended or adjusted under 35 U.S.C. 154(b) by 403 days.

(21) Appl. No.: 13/416,517

(22) Filed: Mar. 9, 2012

(65) Prior Publication Data

US 2013/0234728 A1  Sep. 12, 2013

(51) Int. Cl.
*G01R 27/04* (2006.01)
*G01R 31/28* (2006.01)
*G01R 31/00* (2006.01)

(52) U.S. Cl.
CPC .......... *G01R 31/2841* (2013.01); *G01R 31/001* (2013.01)
USPC ........................................................ 324/633

(58) Field of Classification Search
CPC .......................... G01R 31/2841; G01R 31/001
See application file for complete search history.

(56) References Cited

U.S. PATENT DOCUMENTS

| | | | | |
|---|---|---|---|---|
| 8,537,942 | B2 * | 9/2013 | Olgaard et al. | 375/346 |
| 2002/0093378 | A1 * | 7/2002 | Nielsen et al. | 330/129 |
| 2002/0095686 | A1 * | 7/2002 | Shi et al. | 725/107 |
| 2004/0146132 | A1 | 7/2004 | Staszewski | |
| 2005/0057253 | A1 * | 3/2005 | Gee et al. | 324/409 |
| 2008/0146184 | A1 | 6/2008 | Dessert | |
| 2009/0092177 | A1 | 4/2009 | Dvorak | |
| 2009/0247098 | A1 * | 10/2009 | Gray et al. | 455/161.1 |
| 2010/0007355 | A1 * | 1/2010 | Olgaard et al. | 324/601 |
| 2012/0161749 | A1 * | 6/2012 | Sternberg et al. | 324/76.23 |
| 2012/0269288 | A1 * | 10/2012 | Olgaard et al. | 375/296 |

FOREIGN PATENT DOCUMENTS

KR  10-2010-0042598 A  4/2010

OTHER PUBLICATIONS

International Search Report Dated May 30, 2013 for PCT/US2013/026052; 3 Pages.
Written Opinion Dated May 30, 2013 for PCT/US2013/026052; 4 Pages.

* cited by examiner

*Primary Examiner* — Jermele M Hollington
(74) *Attorney, Agent, or Firm* — Vedder Price P.C.

(57) ABSTRACT

A local oscillator (LO) of a test system is set to an initial frequency whereupon a device under test (DUT) transmits a radio frequency (RF) signal to the test system. Characteristics of the RF signal are measured with the test system and used to identify magnitudes and frequencies of spurious signal products. The LO of the test system is reset to one or more subsequent frequencies that are offset from the initial frequency. One or more subsequent RF signals are transmitted from the DUT to the test system, with the DUT maintaining its original signal settings. Characteristics of the subsequent RF signals are measured with the test system and used to identify magnitudes and frequencies of spurious signal products for each of the subsequent LO frequencies. The spurious signal products that have shifted in frequency for each of the subsequent LO frequencies as self-generated signal products can then be identified.

5 Claims, 6 Drawing Sheets

METHOD FOR IDENTIFYING SELF-GENERATED SPURIOUS SIGNALS

TECHNICAL FIELD

The present invention relates generally to systems and methods for testing electronic equipment. More particularly, it relates to improvements in systems and methods for testing wireless devices using test platforms consisting of hardware, firmware and/or software components.

BACKGROUND

Many of today's handheld devices make use of wireless "connections" for telephony, digital data transfer, geographical positioning and the like. Despite differences in frequency spectra, modulation methods and spectral power densities, the wireless connectivity standards use synchronized data packets to transmit and receive data. In general, all of these wireless capabilities are defined by industry-approved standards (e.g., IEEE 802.11 and 3GPP LTE), which specify the parameters and limits to which devices having those capabilities must adhere.

At any point along the device-development continuum, it may be necessary to test and verify that a device is operating within its standards' specifications. Many such devices are transceivers; that is, they transmit and receive wireless radio frequency (RF) signals. Specialized systems designed for testing such devices typically contain subsystems designed to receive and analyze device-transmitted signals (e.g., vector signal analyzers (VSAs)) and to send signals (e.g., vector signal generators (VSGs)) that subscribe to the industry-approved standards so as to determine whether a device is receiving and processing the wireless signals in accordance with its standard.

It is common for such test systems to generate spurious (or unintended) signals, also known as "spurs," along with the intended signals. Such spurious signals are often associated with fundamental frequencies and harmonics of those fundamental frequencies of existing signals in the tester. For example, a local oscillator (LO) that "mixes" with another signal will produce sum and difference frequencies of its fundamental frequency and the other signal's frequency with which it is mixed. An LO may also produce a second harmonic that is twice its fundamental frequency. That, too, can mix with another signal to produce sum and difference signal products, and so on. Usually such spurious signals are at much lower power levels than the intended signals at the frequencies of interest.

However, in tests in which power spectral density, for example, is being analyzed, the spectral mask can be quite broad, and an instrument-generated spurious signal could be at the same order of power magnitude of a device-under-test's (DUT's) generated signal near the boundaries of a spectral mask. If those spurious signals are not distinguished from the DUT's signal, they could contribute to an analysis that shows unfavorable results, such as a power spectral density failure.

In general, when spurious signals generated by a test instrument are identified, they may be eliminated using digital signal processing (DSP) filtering techniques. However, "notching out" or eliminating a known instrument spurious signal can also notch out or eliminate a DUT signal that may happen to occur at the same frequency of the spurious signal of the test instrument. Not identifying signal products of the DUT and grouping them with spurious signals of the test instrument may present difficulties and inaccuracies during subsequent signal analysis. For example, if a spurious signal of a DUT is grouped and eliminated along with a spurious signal of a test instrument, the DUT may appear to pass a test when, in fact, the DUT may actually fail a power spectral density analysis. Thus, a signal capture of the test system and subsequent signal analysis may be inaccurate and yield faulty results including, for example, yielding false positive(s) or negative(s) on a standard's prescribed test results criteria.

Ideally, it is advantageous to utilize a test instrument that generates no spurious signals. As a practical matter, however, this may not be realistic for all testing scenarios. Therefore, a need exists for identifying instrument-generated spurious signals and distinguishing them from signal products of one or more DUTs configured within a test system. A need also exists for ensuring that the analysis of test results, such as power spectral density results, is not affected by instrument spurs and for ensuring increased accuracy of test results.

SUMMARY

It is, therefore, an object of the present invention to overcome the deficiencies of the prior art to include a method and system for identifying instrument-generated spurious signals and distinguishing them from signal products of a DUT. In accordance with a disclosed exemplary embodiment, a method for identifying self-generated spurious signals is provided that, in at least some aspects of the invention, comprises setting a local oscillator of a test system to an initial frequency and transmitting a radio frequency (RF) signal from a device under test (DUT) to the test system. The method may also measure the physical analog characteristics of the RF signal with the test system. Embodiments include converting the analog values of the measured physical characteristics into digital equivalents, displaying the measured physical characteristics results against power versus frequency axes, identifying spurious signal products in a display and noting the magnitudes and frequencies of the spurious signal products. Additional aspects of the invention may include resetting the local oscillator of the test system to one or more subsequent frequencies that are offset from the initial frequency and transmitting one or more subsequent RF signals from the DUT to the test system, wherein the DUT maintains the original physical signal settings. The method may also provide measuring respective physical analog characteristics of the one or more subsequent RF signals with the test system, converting the analog values of the measured respective physical characteristics into digital equivalents for each of the one or more subsequent LO frequencies, and displaying the measured respective physical characteristics results against power versus frequency axes for each of the one or more subsequent LO frequencies. Spurious signal products may be displayed for each of the one or more subsequent LO frequencies. Embodiments provide noting the magnitudes and frequencies of the spurious signal products for each of the one or more subsequent LO frequencies, and identifying the spurious signal products that have shifted in frequency for each of the one or more subsequent LO frequencies as self-generated signal products.

There has thus been outlined, rather broadly, certain embodiments of the invention in order that the detailed description of the invention herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as in the abstract, are for the purpose of description and should not be regarded as limiting.

As such, those skilled in the art will appreciate that the concept upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments but are for explanation and understanding only.

DETAILED DESCRIPTION OF EMBODIMENTS

The invention will now be described with reference to the drawing figures, in which like reference numerals refer to like elements throughout. The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that the term "signal" may refer to one or more currents, one or more voltages, or a data signal.

Devices of the present invention may be subject to tests for verifying that a device is operating within its standards' specifications. Disclosed embodiments of the device under test (DUT) may include transceivers for transmitting and receiving wireless RF signals. As discussed earlier, specialized systems designed for testing such devices may typically contain subsystems designed to receive and analyze device-transmitted signals (e.g., vector signal analyzers (VSAs)) and to send signals (e.g., vector signal generators (VSGs)) that subscribe to industry-approved standards so as to determine whether a device is receiving and processing the wireless signals in accordance with its standard.

Thus, disclosed embodiments of the test system may be configured to receive an RF signal of a DUT and capable of measuring the physical analog characteristics of the RF signal. The test system may also convert the physical characteristics of the measured analog values into digital equivalents. The measured physical characteristic results may be displayed graphically, for example, along power versus frequency axes, whereupon spurious signal products may be identified and subsequently analyzed.

Thus, as spurious signals are generated under the disclosed test, the present invention identifies instrument-generated spurious signals and distinguishes them from signal products of one or more DUTs. Disclosed embodiments may also ensure that the analysis of power spectral density results is not affected by sources, such as instrument spurs, and provides increased accuracy of test results.

Figure 1:
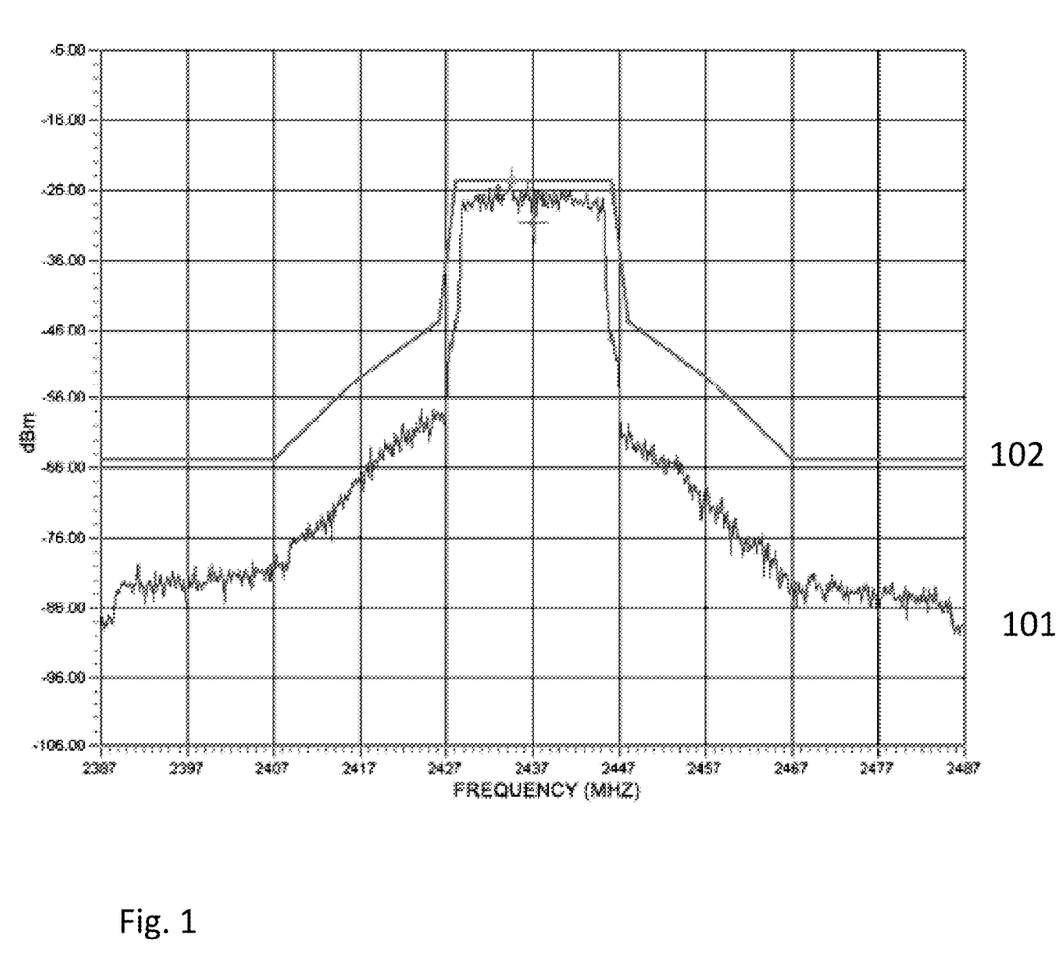
FIG. 1 illustrates a typical Orthogonal Frequency-Division Multiplexed (OFDM) signal superimposed upon a spectral mask outline according to an exemplary disclosed embodiment.

FIG. 1 depicts a typical Orthogonal Frequency-Division Multiplexed (OFDM) signal 101 superimposed upon a spectral mask outline 102. In this case, the intended DUT signals occupy the spectrum between 2427 and 2447 MHz (a 20 MHz bandwidth). The signals above and below those spectrum limits have been filtered such that their power is well below the spectral mask limits.

A device designed to transmit OFDM RF signal 101 may be employed to produce signal products with highest power in a spectral bandwidth of interest (e.g., 2427-2447 MHz, in this example). To ensure that there is minimal interference among devices, for example, those sharing the licensed or unlicensed spectrum, such devices must limit the power of signal products that fall outside the spectral bandwidth of interest. The allowable power limits of such a signal are outlined by spectral power density mask 102. Thus, the signal shown in FIG. 1 falls within acceptable limits of the standard that governs it, such as IEEE 802.11x.

Figure 2:
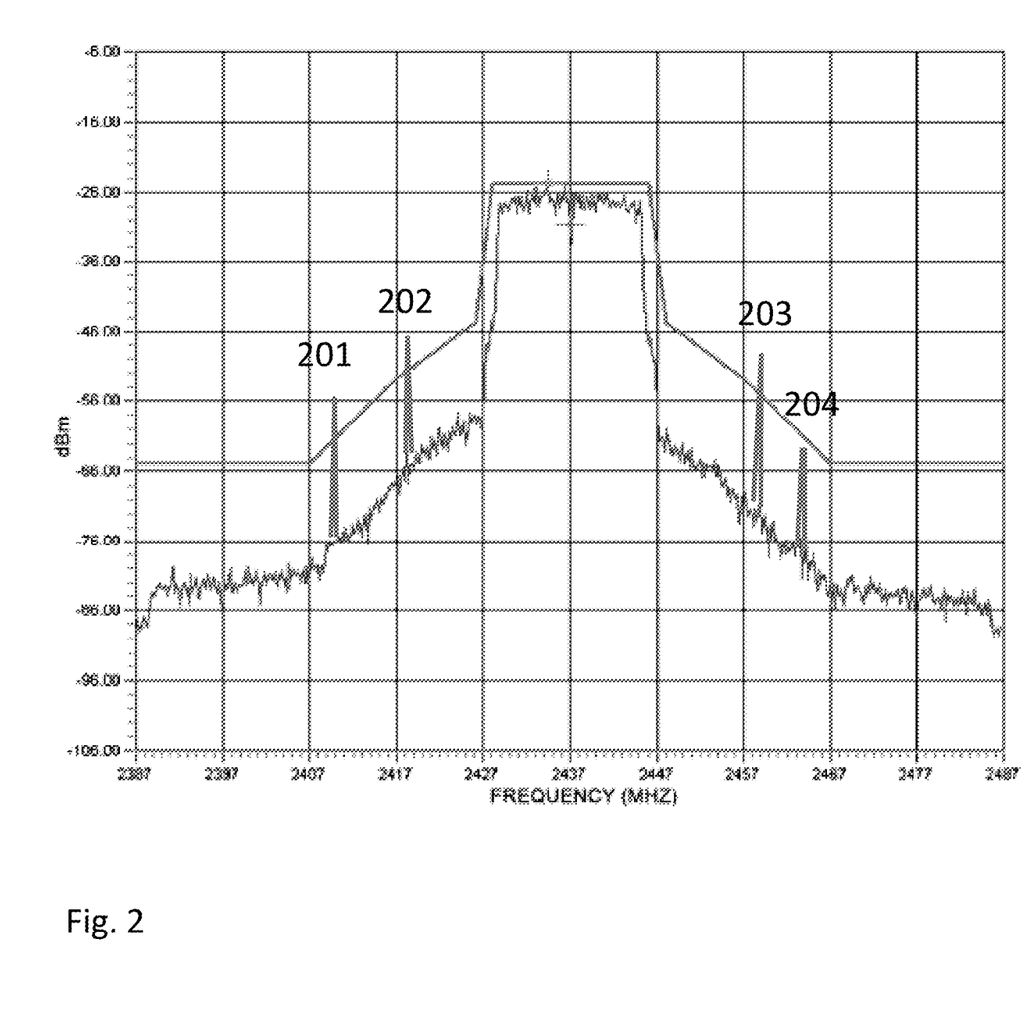
FIG. 2 illustrates an OFDM signal having spurious signal products superimposed upon a spectral mask outline according to an exemplary disclosed embodiment.

FIG. 2 depicts a typical OFDM signal superimposed upon a spectral mask, as in FIG. 1. However, in this example, four spurious signal products 201, 202, 203 and 204 occur at approximately 2409, 2419, 2459 and 2463 MHz, respectively. These spurious signal products could be generated by the device being tested (DUT) itself, or the aforementioned signal products could be generated by the testing instrument. Alternatively, the spurious signal products could be a combination of spurs generated from both the DUT and the test instrument, including, perhaps, a spur that is actually two spurs coincident at the same frequency and constructively interfering. The present example illustrates that spurious signals exceed the power limits of the spectral mask in three instances at 201, 202 and 203. However, with this single capture, one cannot determine which spurs are generated by the DUT and which spurs are generated by the test instrument.

Figure 3:
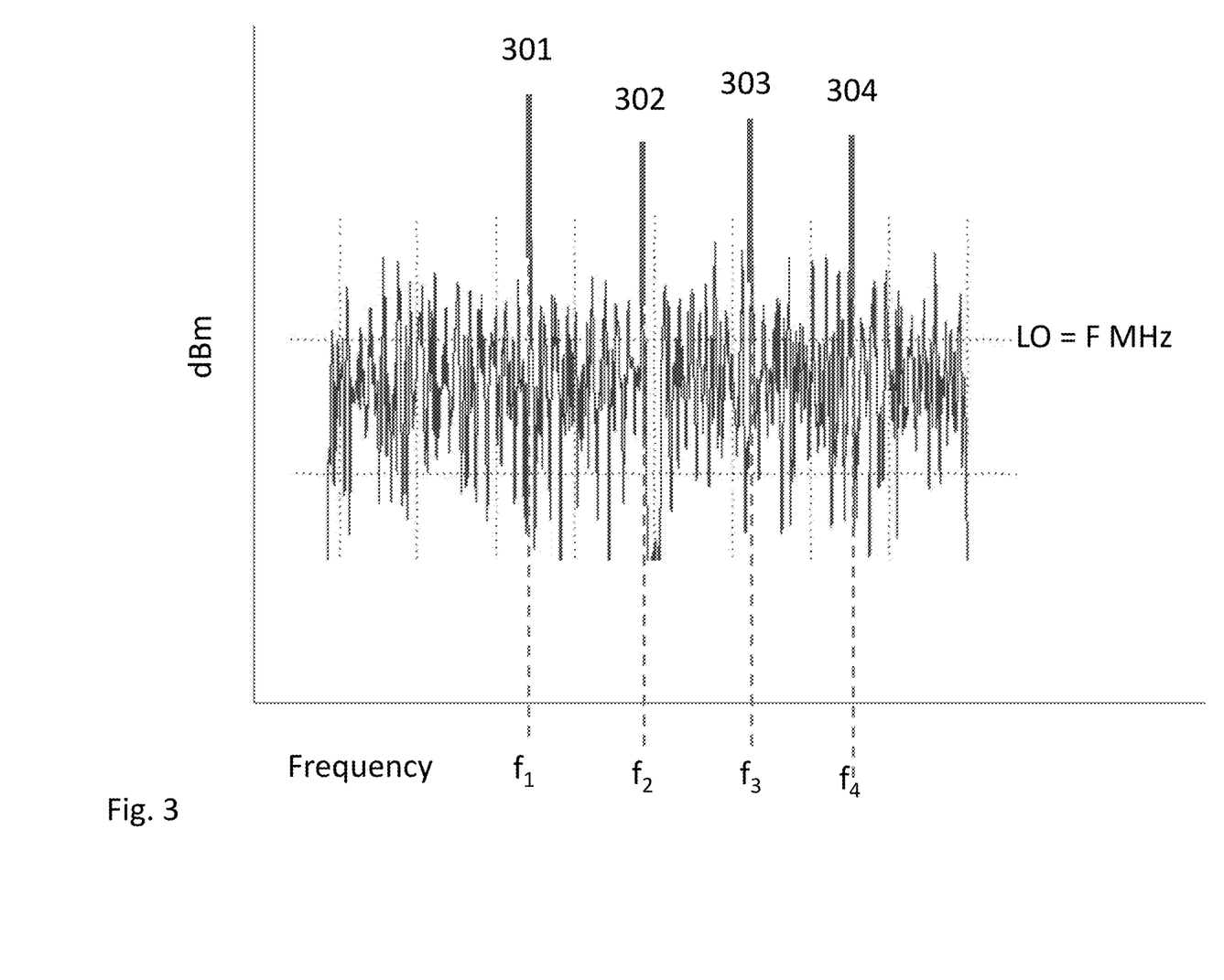
FIG. 3 illustrates an OFDM signal captured on a test instrument set at a prescribed frequency according to an exemplary disclosed embodiment.

Referring to FIG. 3, a signal is captured from a DUT and analyzed in the frequency domain showing the existence of four spurious signals 301, 302, 303 and 304. The local oscillator (LO) of the testing instrument is set at a frequency of F MHz. Spurious signals 301, 302, 303 and 304 occur at frequencies $f_1$, $f_2$, $f_3$ and $f_4$, respectively, as shown. Again, with this single capture, one cannot discern whether one or more of the spurious signals are generated by the DUT or by the testing instrument.

Figure 4:
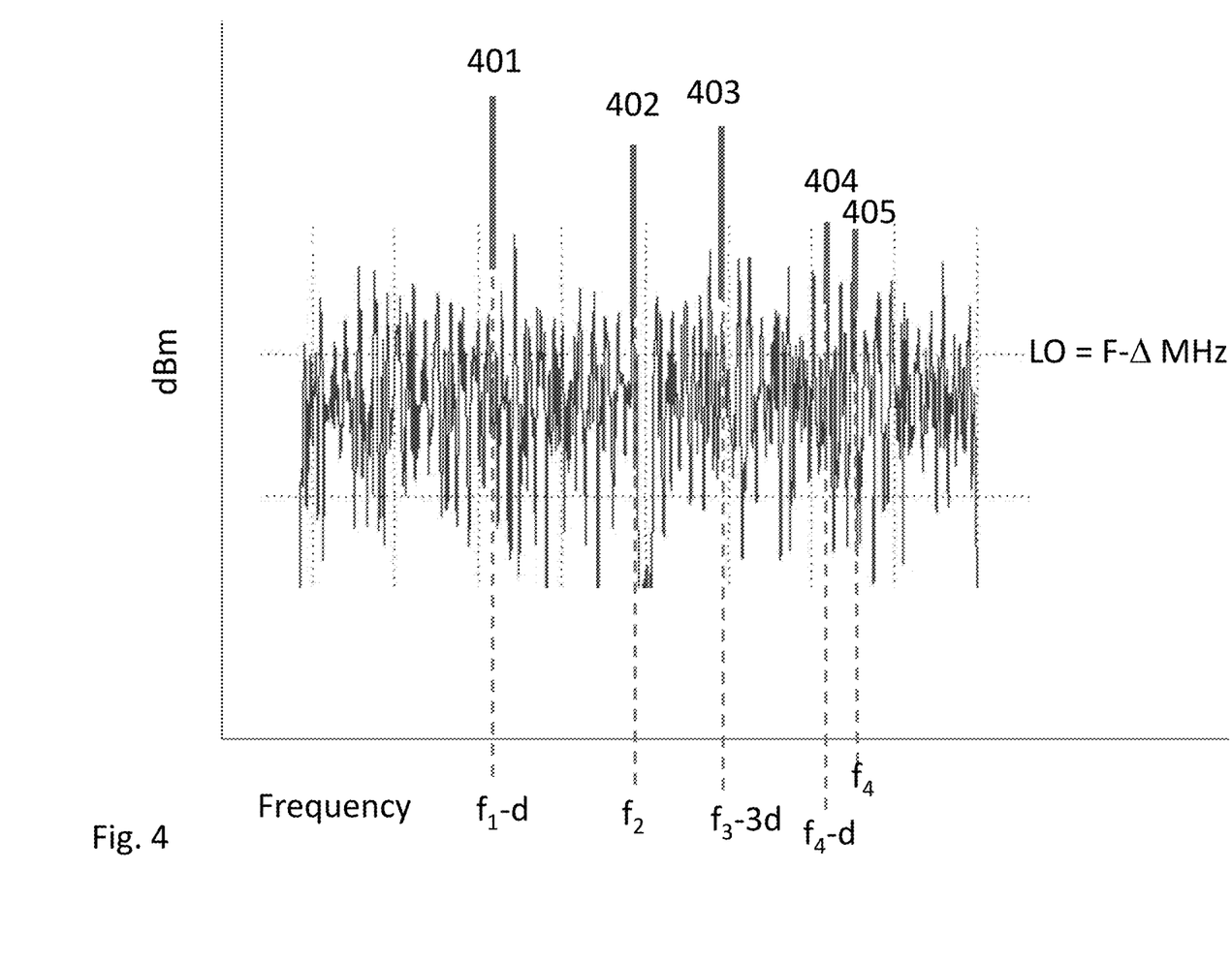
FIG. 4 illustrates the OFDM signal of FIG. 3 captured on the test instrument set at another prescribed frequency according to an exemplary disclosed embodiment.

FIG. 4 depicts the same signal of FIG. 3, where the local oscillator frequency of the testing instrument has been changed from F MHz to F-Δ MHz. When the LO frequency is changed, it is noted that of the four spurious signals shown in FIG. 3, the previous spurious signal 301 at frequency $f_1$ is now at $f_1$-d MHz 401; previous spurious signal 303 at frequency $f_3$ is now at $f_3$-3d MHz 403; and previous spurious signal 304 at frequency $f_4$ now shows two spurs—one still at frequency $f_4$ 405 and one at $f_4$-d MHz 404. An analysis reveals that three of the frequency shifts were first-order products (i.e., where the shift was fn-d), and one was a higher-order product (i.e., where the shift was fn-3d).

Accordingly, FIG. 4 illustrates a second capture of the signal of a DUT wherein the LO frequency of the test instrument is set to F-Δ MHz. After the capture, it is noted that the first spurious signal 401 and the third spurious signal 403 have both shifted in frequency from $f_1$ and $f_3$ MHz to $f_1$-d and $f_3$-3d MHz, respectively. The second spurious signal 402, however, still occurs at $f_2$ MHz. The spurious signal 405 that previously occurred at $f_4$ MHz, now appears reduced in magnitude, and a new spurious signal 404 appears at $f_4$-d MHz. It is noted that the shift might have been higher than the first order and that the frequency shift of the spurious signal may have been some multiple of d. Based on the frequency shifts and signal magnitudes, it may be concluded that spurious signal 401 at $f_1$ MHz is generated by the testing instrument and directly related to the shift in LO frequency. Spurious signal 402 at $f_2$ MHz, remaining fixed in frequency and magnitude, is, therefore, concluded to be generated by the DUT. Spurious signal 403 (at $f_3$-3d MHz) also shifted in frequency from $f_3$ during the second data capture. Hence, spurious signal 403 is concluded to be generated by the testing instrument and is related to a harmonic of the LO frequency (e.g., the spurious signal shifted by 3d rather than d). The spurious signal at frequency $f_4$ is actually a coincident of spurs generated from the testing instrument and the DUT both occurring at frequency $f_4$ when the LO is set to frequency F (as in FIG. 3). But, when the LO is set to frequency F-Δ MHz, the spurious signal at frequency $f_4$ is separated as indicated by spurious signal 404 shifted to $f_4$-d MHz. Due to the shift in frequency during the second data capture, it is, therefore, determined that spurious signal 404 is generated by the testing instrument. Alternatively, spurious signal 405 remains at frequency $f_4$ during the second data capture and is, therefore, concluded to be generated by the DUT. When separated, the magnitudes of each spurious signal 404, 405 are lower, because they were previously interfering constructively with one another (i.e., when the LO was set to F), and are now no longer interfering constructively when they are shifted relative to one another.

Figure 5:
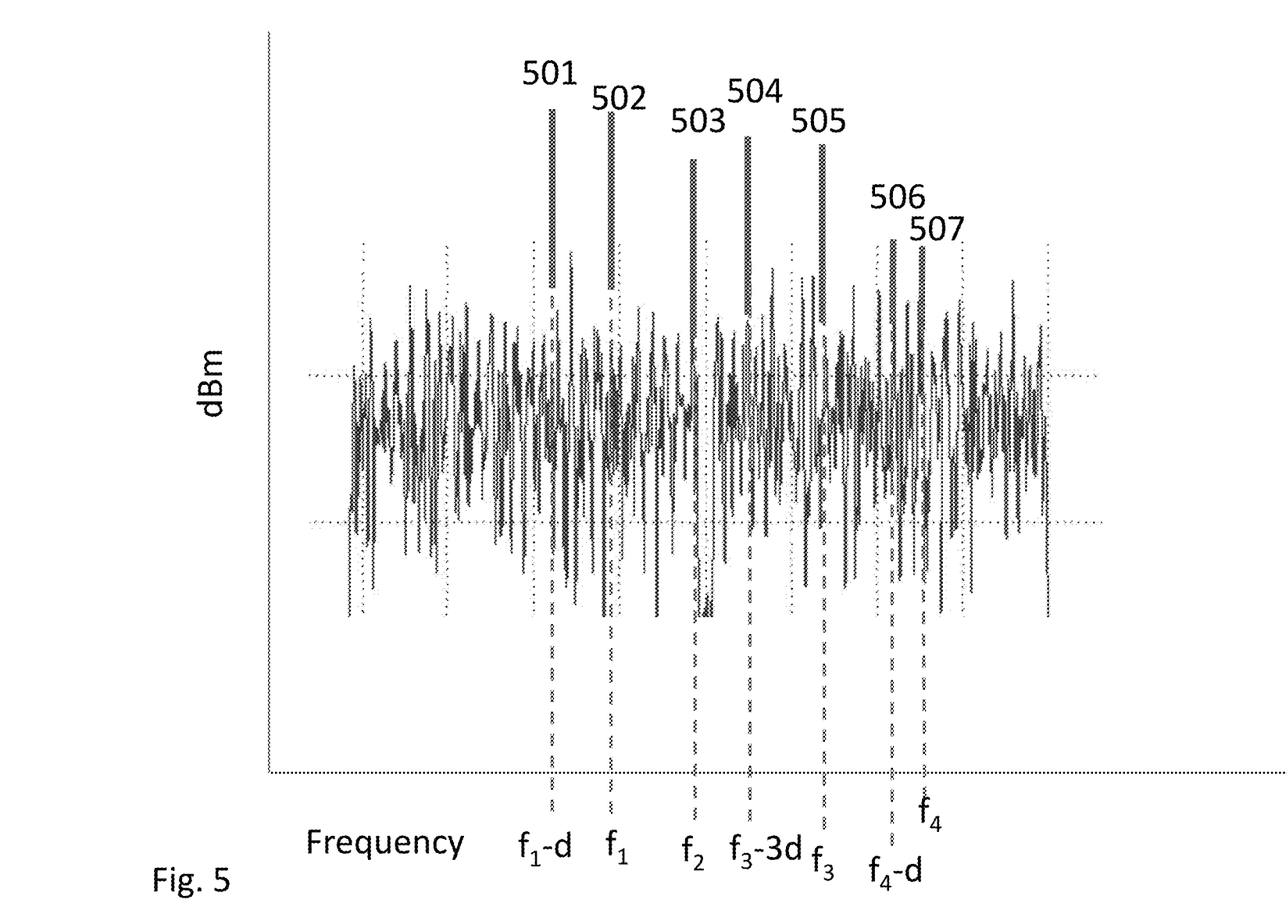
FIG. 5 illustrates the OFDM signals of FIG. 3 and FIG. 4 superimposed on one another according to an exemplary disclosed embodiment.

FIG. 5 provides a snapshot of the four signals generated when the local oscillator was originally set to F MHz. FIG. 5 also illustrates those signals generated when the local oscillator was set at F-Δ MHz. Thus, the results of the first data capture (as depicted in FIG. 3) and the second data capture (as depicted in FIG. 4) are displayed simultaneously in FIG. 5. An analysis of the displayed results indicates that three of the four spurious signals shifted in frequency with the shift in local oscillator frequency. First-order products shifted by the amount of LO shift, whereas higher-order products shifted by multiples of the LO shift. This indicates that the first 501 and third 504 spurious signals, and one of two coincident spurious signals at frequency $f_4$ 506 are generated by the test instrument rather than by the DUT. The second spur 503 and one of two coincident spurs at frequency $f_4$ 507 are generated by the DUT.

Since spurious signals 501 and 504 shifted in frequency (from spurious signals 502 and 505, respectively) when the LO shift occurred during the second data capture, disclosed embodiments of the invention determine that spurious signals 501, 502, 504, and 505 are generated by the test instrument. Described embodiments also determine that when the LO is set to frequency F-Δ MHz, the spurious signal at frequency $f_4$ is separated (as noted by spurious signal 506 shifted to frequency $f_4$-d MHz, while spurious signal 507 remains at frequency $f_4$). Hence, the disclosed invention determines that due to the shift of spurious signal 506 during the second data capture, spurious signal 506 is generated by the test instrument. Spurious signals 503 and 507 did not shift during the second data capture and are, therefore, determined to be generated by the DUT.

Figure 6:
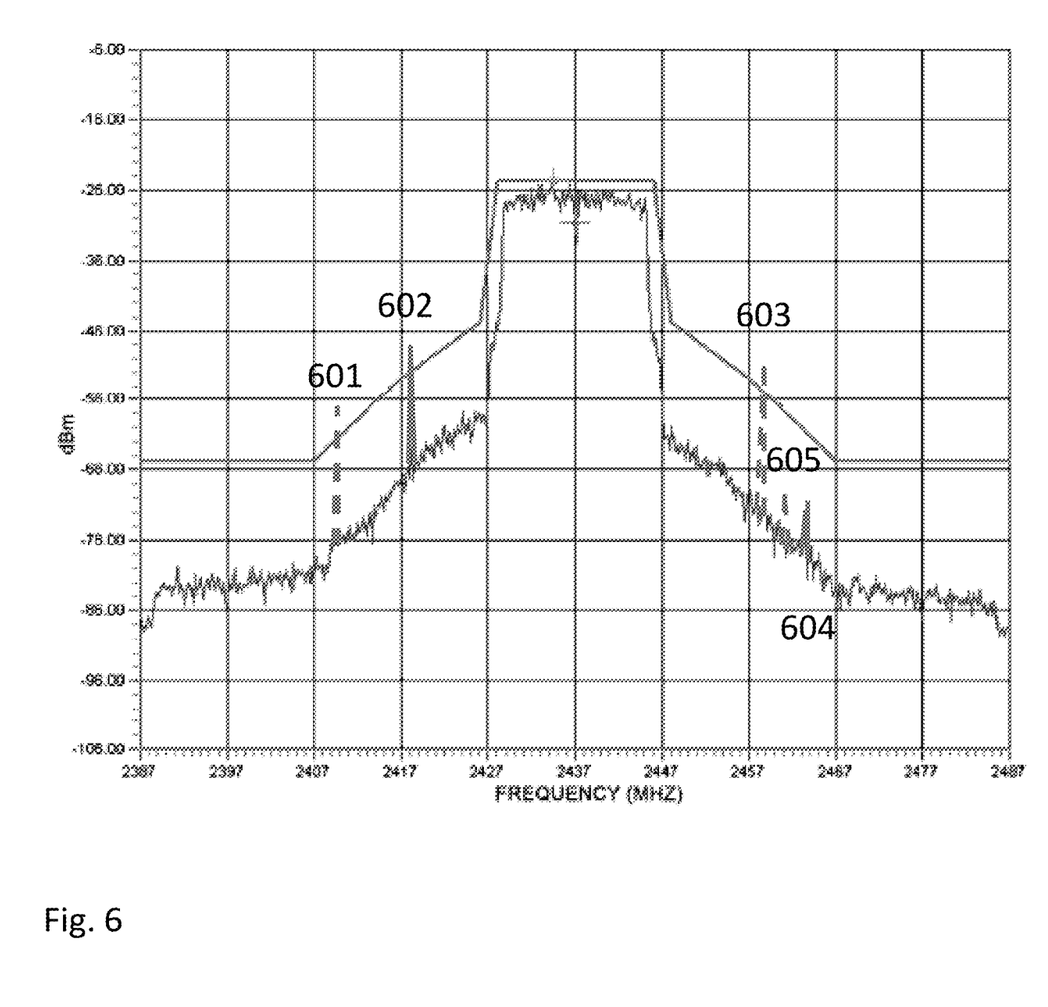
FIG. 6 illustrates an OFDM signal, including the signal captures of FIGS. 3 and 4, superimposed upon a spectral mask outline for identifying spurious signals according to an exemplary disclosed embodiment. It shows the spurious signals contributed by the tester having been filtered out of the results.

FIG. 6 depicts an example showing the result of identifying the first and third spurious signals and one of two coincident spurious signals (generated by the test instrument) and filtering them out, while leaving the second and one of two coincident signal products (generated by the DUT) remaining. This represents a more accurate result of the signal products generated by the DUT than if all three spurs were to remain in the displayed data capture, or if all three spurious signals were eliminated (for example, with DSP filtering techniques). As a result of the two aforementioned data captures (e.g., as shown in the signal snapshots illustrated in FIGS. 3 and 4), with LO still set at F-Δ MHz, described embodiments, as shown in FIG. 6, more readily identify spurious signals that are generated by the test instrument. In this case, spurious signals 601, 603 and 605 are easily identified as being generated by the test instrument. Disclosed embodiments may employ digital signal processing (DSP) and filtering techniques to further refine the results. For example, filtering the signal characteristics of spurious signals generated by the test instrument (e.g., spurious signals 601, 603 and 605) may reflect the contribution of only spurious signals 602 and 604 that are generated by the DUT. In this manner, the disclosed invention facilitates the generation of signal data captures more efficiently, and subsequent analysis of the data capture occurs more accurately. For example, disclosed embodiments provide analytical determinations of spurious signals produced by a DUT to check, for instance, whether the aforementioned spurious signals occur within a prescribed frequency range of the frequency spectrum. Another analysis may include determining non-compliant spurious signals, for example, by investigating the power strength levels of respective spurious signals with respect to the power limits indicated by a spectral mask. By way of example, in accordance with disclosed embodiments, FIG. 6 illustrates the DUT-generated spurious signal 602 easily determined as occurring outside of the acceptable tolerance of the spectral mask.

As will be readily appreciated, it is possible that after one LO shift a different spurious signal may be generated and, in fact, move to a frequency occupied by a previous spurious signal. As such, the aforementioned generated spurious signal is regarded to be generated by the DUT rather than the testing instrument. Disclosed embodiments of the invention may employ a second LO shift at a frequency harmonically unrelated to either the first LO frequency or the first LO shift in order to further distinguish spurious signals that are generated from the test instrument as opposed to spurious signals that are generated by a DUT.

Therefore, disclosed embodiments of the present invention provide a method for identifying instrument-generated spurious signals and distinguishing them from signal products of a DUT. The present disclosure ensures that analyses of spurious signals is not affected by spurious signals generated by a testing instrument. In addition, the present disclosure increases the efficiency and accuracy of analyzing spurious signals. The present invention identifies spurious signals generated by a testing instrument. Current embodiments may also employ DSP techniques to identify and filter spurious signals within a frequency spectrum to distinguish them from signal products generated by a DUT. In this manner, the invention may account for the spurious signal of a DUT should a signal product of the DUT coincide with a spurious signal of a testing instrument. The invention is capable of efficiently and quickly capturing a prescribed signal spectrum and analyzing the same. The analysis may include adjusting and filtering the signal spectrum to eliminate any spurious signals that are not a measurement of the quality of spurious signals generated from a DUT. Thus, any contribution of spurious signals from the testing device is not included in the improved signal analysis of the present invention.

In accordance with disclosed embodiments, the present invention is capable of eliminating, specifically, instrument-generated spurious signals without inadvertently eliminating signal products of coincident frequency produced by an employed DUT during a signal capture. Thus, the improved techniques of the present disclosure reduce or eliminate false positive(s) or negative(s) on a standard's prescribed test results criteria.

It will be apparent to those skilled in the art that various modifications and variations can be made in the disclosed apparatus and method without departing from the scope of the disclosure. Additionally, other embodiments of the apparatus and method will be apparent to those skilled in the art from consideration of the specification. It is intended that the specification and examples be considered as exemplary only, with a true scope of the disclosure being indicated by the following claims and their equivalents.

The system, as described in the present technique or any of its components, may be embodied in the form of a computer system. Typical examples of a computer system include a general-purpose computer, a programmed microprocessor, a microcontroller, a peripheral integrated circuit element, and other devices or arrangements of devices that are capable of implementing the steps that constitute the method of the present technique.

The computer system comprises a computer, an input device, a display unit and/or the Internet. The computer further comprises a microprocessor. The microprocessor is connected to a communication bus. The computer also includes a memory. The memory may include random access memory (RAM) and read only memory (ROM). The computer system further comprises a storage device. The storage device can be a hard disk drive or a removable storage drive such as a floppy disk drive, optical disk drive, etc. The storage device can also be another similar means for loading computer programs or other instructions into the computer system. The computer system also includes a communication unit. The communication unit allows the computer to connect to other databases and to the Internet through an I/O interface. The communication unit allows the transfer as well as the reception of data from other databases. The communication unit may include a modem, an Ethernet card or any similar device that enables the computer system to connect to databases and networks such as LAN, MAN, WAN and the Internet. The computer system facilitates inputs from a user through an input device, accessible to the system through an I/O interface.

The computer system executes a set of instructions that are stored in one or more storage elements, in order to process input data. The storage elements may also hold data or other information as desired. The storage element may be in the form of an information source or a physical memory element present in the processing machine.

The set of instructions may include various commands that instruct the processing machine to perform specific tasks such as the steps that constitute the method of the present technique. The set of instructions may be in the form of a software program. Further, the software may be in the form of a collection of separate programs, a program module with a larger program or a portion of a program module, as in the present technique. The software may also include modular programming in the form of object-oriented programming. The processing of input data by the processing machine may be in response to user commands, to results of previous processing or to a request made by another processing machine.

While the foregoing description is presented to enable a person of ordinary skill in the art to make and use the technique, and is provided in the context of the requirement for obtaining a patent. The present description is the best presently contemplated method for carrying out the present technique. Various modifications to the preferred embodiment will be readily apparent to those skilled in the art, and the generic principles of the present technique may be applied to other embodiments, and some features of the present technique may be used without the corresponding use of other features. Accordingly, the present technique is not intended to be limited to the embodiment shown but is to be accorded the widest scope consistent with the principles and features described herein. Furthermore, it will clear to those skilled in the art that multiple captures are not always required. Once a tester's spurious signals are known, their location and power can be stored, and those spurious signals filtered out when capturing DUT signals. In such a case, one would execute the multiple captures as described on a scheduled basis to ensure that the power of such spurious signals do not change over time.

What is claimed is:

1. A method for identifying self-generated spurious signals comprising:

setting a local oscillator of a test system to an initial frequency;

transmitting a radio frequency (RF) signal from a device under test (DUT) to the test system;

measuring the physical analog characteristics of the RF signal with the test system;

converting the analog values of the measured physical characteristics into first digital equivalents;

identifying spurious signal products in accordance with said first digital equivalents;

identifying the magnitudes and frequencies of the spurious signal products;

resetting the local oscillator of the test system to one or more subsequent frequencies that are offset from the initial frequency;

transmitting one or more subsequent RF signals from the DUT to the test system, wherein the DUT maintains the original physical signal settings;

measuring respective physical analog characteristics of the one or more subsequent RF signals with the test system;

converting the analog values of the measured respective physical characteristics into second or more digital equivalents for each of the one or more subsequent LO frequencies;

identifying spurious signal products for each of the one or more subsequent LO frequencies in accordance with said second or more digital equivalents;

identifying the magnitudes and frequencies of the spurious signal products for each of the one or more subsequent LO frequencies; and identifying the spurious signal products that have shifted in frequency for each of the one or more subsequent LO frequencies as self-generated signal products.

2. A method as in claim 1, wherein:

said identifying spurious signal products in accordance with said first digital equivalents comprises displaying the measured physical characteristics results against power versus frequency axes; and said identifying spurious signal products in a display for each of the one or more subsequent LO frequencies in accordance with said second or more digital equivalents comprises displaying the measured respective physical characteristics results against power versus frequency axes for each of the one or more subsequent LO frequencies.

3. A method as in claim 1, further comprising:

filtering the spurious signal products that have shifted in frequency for each of the one or more subsequent LO frequencies from the signal products otherwise identified.

4. A method for identifying self-generated spurious signals comprising:

setting a test system to an initial frequency;

transmitting a first signal from a device under test (DUT) to the test system;

measuring the characteristics of the first signal;

identifying spurious signal products from the measured characteristics of the first signal;

resetting the test system to one or more subsequent frequencies that are offset from the initial frequency;

transmitting one or more subsequent signals from the DUT to the test system, wherein the DUT maintains the original physical signal settings;

measuring respective characteristics of the one or more subsequent signals;

identifying spurious signal products for each of the one or more subsequent frequencies;

identifying the spurious signal products that have shifted in frequency for each of the one or more subsequent frequencies as self-generated signal products.

5. A method as in claim 4, further comprising:

filtering the spurious signal products that have shifted in frequency for each of the one or more subsequent frequencies from the signal products otherwise identified.

* * * * *